United States Patent [19]

Matano

[11] Patent Number: 5,566,119
[45] Date of Patent: Oct. 15, 1996

[54] SYNCHRONOUS DRAM PERFORMING REFRESH OPERATION A PLURALITY OF TIMES IN RESPONSE TO EACH REFRESH REQUEST COMMAND

[75] Inventor: Tatsuya Matano, Tokyo, Japan

[73] Assignee: NEC Corporation, Tokyo, Japan

[21] Appl. No.: 558,264

[22] Filed: Nov. 13, 1995

[30] Foreign Application Priority Data

Nov. 10, 1994 [JP] Japan .................................. 6-300178

[51] Int. Cl.⁶ .............................. G11C 7/00; G11C 8/00
[52] U.S. Cl. ...................... 365/222; 365/230.06; 365/233
[58] Field of Search .............................. 365/222, 230.06, 365/233

[56] References Cited

U.S. PATENT DOCUMENTS 5,446,696  8/1995  Ware et al. .............................. 365/222
5,511,033  4/1996  Jung .......................................... 365/222

*Primary Examiner*—David C. Nelms
*Assistant Examiner*—Trong Phan
*Attorney, Agent, or Firm*—Sughrue, Mion, Zinn, Macpeak & Seas

[57] ABSTRACT

A semiconductor memory device is disclosed as a synchronous DRAM. This DRAM includes a refresh control circuit 4, 5 responding to a refresh request RF supplied thereto and performing a refresh operation at least twice. In the first refresh operation, one of word lines WL is selected and memory cells 13 associated with the selected word line are refreshed, and thereafter a different one of the word lines WL is selected and memory cells 13 associated therewith are refreshed in the next refresh operation.

10 Claims, 5 Drawing Sheets

SYNCHRONOUS DRAM PERFORMING REFRESH OPERATION A PLURALITY OF TIMES IN RESPONSE TO EACH REFRESH REQUEST COMMAND

BACKGROUND OF THE INVENTION

1. Field of the Invention

The present invention relates to a dynamic random access memory device (DRAM) and, more particularly, to a synchronous DRAM operating in synchronous with a clock signal supplied thereto.

2. Description of the Related Art

In order to has a DRAM operates at more higher speed, a synchronous DRAM has been developed and put into practical use. The synchronous DRAM operates in synchronism with a clock signal supplied thereto from a microprocessor, a microcomputer or a microcontroller (called collectively a "CPU). The CPU also supplies the synchronous DRAM with a data-read command or a data-write command. In response thereto, the DRAM operates to read or write data from or into a selected memory cell or cells in synchronism with the clock signal.

As well known in the art, a refresh operation is also necessary for the synchronous DRAM to prevent the destruction of data stored in each memory cell. The CPU is therefore required to further issue a refresh request command to the synchronous DRAM. In response to this command, the synchronous DRAM initiates a refresh operation in which one word line is selected by the content of an internal refresh address counter and the memory cells connected to the selected word lines are refreshed.

It is to be noted here that a cycle of issue of the refresh request command is standardized to be 15.625 µsec. In other words, the refresh request command is issued by the CPU every 15.625 µsec. The synchronous DRAM thus performs the refresh operation in such a manner as described above.

Referring to FIG. 1, a synchronous DRAM 1 is coupled to a CPU 1 to receive a clock signal CLOCK. The CPU 1 supplies a data-write or a data-read command to the DRAM 2 in synchronism with the clock signal CLOCK. The command thus supplied is decoded by a command decoder 3 which then produces and supplies decoded information 31 to an internal control circuit 4. The DRAM 2 is thus brought into a desired operation controlled by a set of internal control signals 41 form the circuit 4. The CPU 1 further supplies address signals A0 to An an address buffer 6 to designate a memory cell which is to be subject to the desired operation. A row decoder 7 receives row address information and a column decoder 8 receives column address information from the address buffer 6. As a result, one of word lines WL and one of bit lines BL in a memory cell array 16 are selected to designate one of memory cells 13, Note that in the drawing, only one word line, only one bit line and only one memory cell are shown. A sense-amplifier/multiplexer circuit 9 is further activated, so that data stored in the memory cells connected to the selected word lines are applied and then restored thereinto.

When the command from the CPU 1 is a data-read mode, the selected memory cell is coupled through the multiplexer circuit 9 to a data output buffer 11. The data stored in the selected memory cell is thus read out as an output data Dout.

In the case of the data-write command being supplied, an input data Din is written into the selected memory cell by a data input buffer 10.

When the CPU issues a refresh request command in synchronism with the clock signal, as shown in FIG. 2, the command decoder 3 decodes this command and supplies a refresh request signal RF to the internal control circuit 4 and further to refresh control circuit 5. In response to the change of the refresh request signal RF to the active high level, the refresh control circuit 5 operates to transfer the content of an internal refresh address counter 12 to the row decoder 7. On the other hand, the control circuit 4 produces the set of internal control signals 41 for a refresh operation. As a result, one of the word lines WL is selected by the row decoder 7 in response to the content of the internal address counter 12 and driven by a driver 14, as shown in FIG. 2. Further, the sense amplifier circuit 9 is activated to thereby refresh the memory cells coupled to the selected word line Wi.

The control circuit 4 has an S-R flip-flop 42 which is brought into a set state by the refresh request signal RF. A refresh mode signal RFMD is thereby changed to the high level, as shown in FIG. 2. The high level of the signal RFMD prevents the command decoder 3 from responding to a command issued later from the CPU 1.

When a period of time required to perform the refresh operation has been elapsed, the refresh control circuit 5 changes a refresh end signal RFEND to the high level, as shown in FIG. 2. In response thereto, the content of the address counter 12 is updated. In response further to the signal RFEND, the control circuit 4 stops producing the refresh control signals 41 to change the selected word line WLi to the non-selection (low) level, and then produces a set of signals 41 to bring the memory circuit to a reset-precharge state. The circuit 4 further produces a precharge end signal PREND upon completion of the reset-precharge state. The flip-flop 42 is thereby reset to change the refresh mode signal RFMD to the low level, as shown in FIG. 2. The command decoder 3 is thus allowed to respond to a command from the CPU 1.

Thus, in response to one refresh command, one refresh operation is performed to select one of word lines and refresh the memory cells connected to the selected word line.

The memory capacity, i.e. the number of memory cells, of the DRAM has been increasing more and more. In accordance therewith, the size of each cell is shrunk to remarkably shorten its data holding time indicative of a time period during which the memory cell retains the data therein.

On the other hand, the synchronous DRAM receives the refresh request command in the standardized cycle as described above. For this reason, it becomes difficult that all the memory cells are refreshed at least once within the data holding time.

SUMMARY OF THE INVENTION

It is therefore an object of the present invention to provide a DRAM having an improved refresh circuit.

It is another object of the present invention to provide a synchronous DRAM all memory cells are refreshed at least once within the respective data holding time even if a refresh request command is issued from a CPU in a constant cycle.

A DRAM according to the present invention comprises a memory cell array including a plurality of word lines, a plurality of bit lines and a plurality of memory cells disposed at a different one of intersections of the word and bit lines, a data read/write circuit performing a data read/write operation on a selected one of the memory cells, and a refresh circuit responding to each refresh request and performing both of a first refresh operation in which one of the word lines is selected and the memory cells associated with the one of the word lines are refreshed and a second refresh operation in which a different one of the word lines and the different memory cells associated with the different one of the word lines are refresh.

With the above arrangement, at least two word lines are selected and the memory cells associated with each of the two word lines are refreshed each time a refresh request is issued. Accordingly, it is possible to perform a refresh operation on each memory cell within its data holding time even if the refresh request is issued in a constant cycle.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 1:
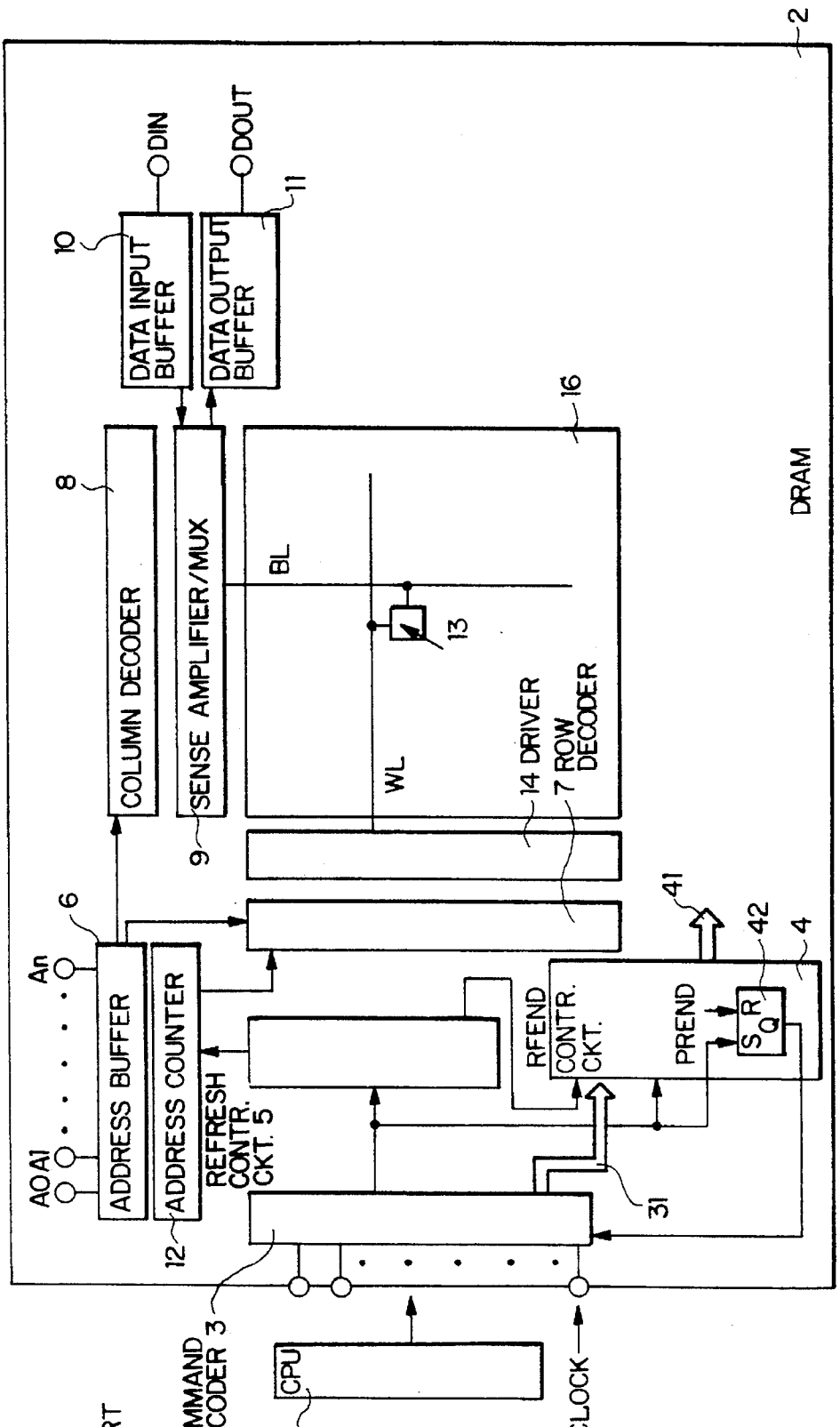
FIG. 1 is a block diagram showing a circuit configuration according to the prior art.
Figure 2:
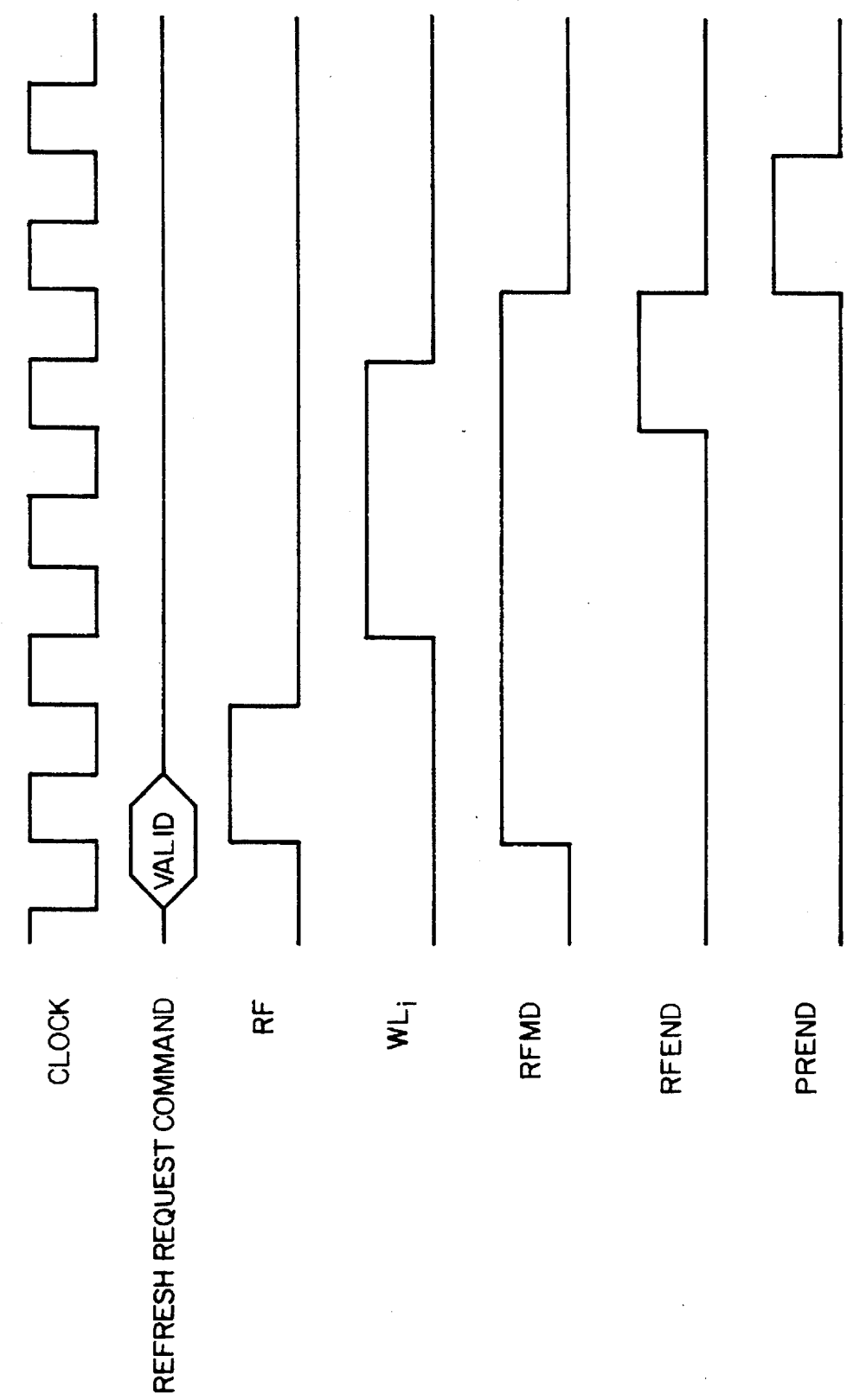
FIG. 2 is a timing chart explaining a refresh operation of the memory shown in FIG. 1.
Figure 3:
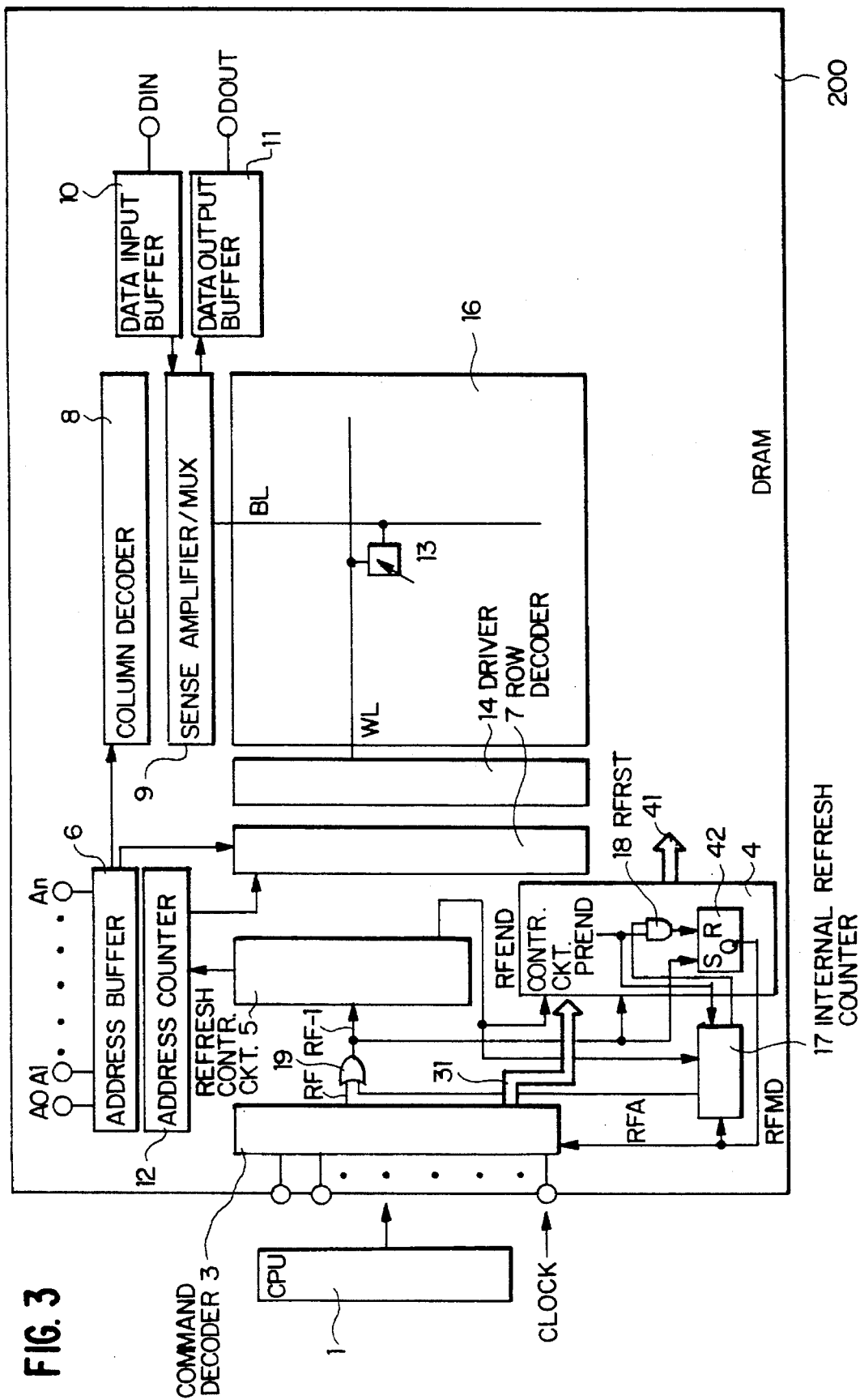
FIG. 3 is a block diagram showing a synchronous DRAM according to an embodiment of the present invention.

Referring now to FIG. 3, a synchronous DRAM 200 according to an embodiment of this invention includes is fabricated as an integrated circuit device on a single semiconductor chip, in which the same constituents as those shown in FIG. 1 are denoted by the same reference numerals to omit the further description thereof. In this DRAM 200, an internal refresh counter 17 is provided in accordance with the present invention to control the number of times of refresh operations to be performed in response to each refresh request command. In this embodiment, the number of times of refresh operations to be performed is set to two. That is, the refresh operation is performed twice in response to each refresh request command. Until the time of the refresh operation reaches two, therefore, the counter produces an internal refresh request signal RFA each time one refresh operation is completed, which signal RFA is in turn supplied through an OR gate 19 to the control circuits 5 and 4. Until the time of the refresh operation reaches two, further, the internal refresh counter 17 maintains a refresh reset signal RFRST to the low level which causes through an AND gate 18 to present the flip-flop 42 from being reset. That is, the refresh mode signal RFMD is held at the high level until the refresh operation is performed twice.

Figure 4:
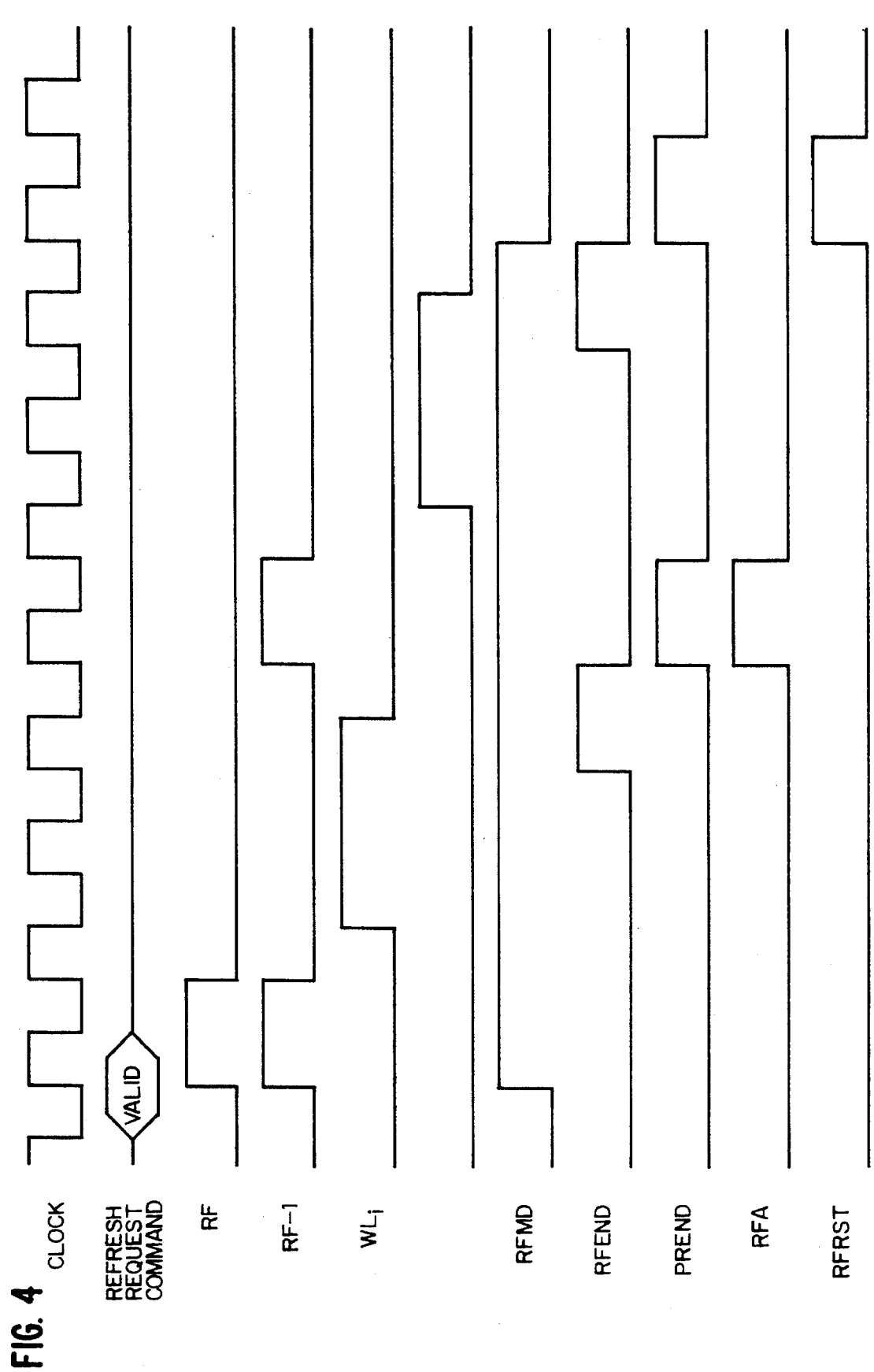
FIG. 4 is a timing chart explaining a refresh operation of the DRAM shown in FIG. 3.

In operation, when the CPU 1 issues a refresh request command in synchronism with the clock signal, as shown in FIG. 4, the command decoder 3 decodes this command and produces the refresh request signal RF. This signal RF is transferred through the OR gate 19 to the refresh control circuit 5 and the internal control circuit 4 as a refresh request signal RF-1, as shown in FIG. 4. Thus, a refresh operation is performed in the manner as mentioned before. Specifically, the circuit 5 operates to transfer the content of the address counter 12 to the row decoder 7. On the other hand, the R-S flip-flop 42 in the circuit 4 outputs the high level refresh mode signal RFMD as shown in FIG. 4 to prevent the command decoder 3 from responding to a further command from the CPU 1. The control circuit 4 further produces the set of internal control signals 41 for a refresh operation. As a result, one of the word lines WLi is selected by the row decoder 7 in response to the content of the address counter 12 and driven by a driver 14 to the selection (high) level, as shown in FIG. 4. Further, the sense amplifier circuit 9 is activated to refresh the memory cells coupled to the selected word line WLi.

When a period of time required to perform the refresh operation has elapsed, the refresh control circuit 5 changes a refresh end signal RFEND to the high level, as shown in FIG. 4. In response thereto, the content of the address counter 12 is updated by the refresh control circuit 5. In response further to the signal RFEND, the internal control circuit 4 stops generating the refresh control signal 41 to change the selected word line WLi to the non-selection (low) level, and produces the precharge end signal PREND.

Figure 5:
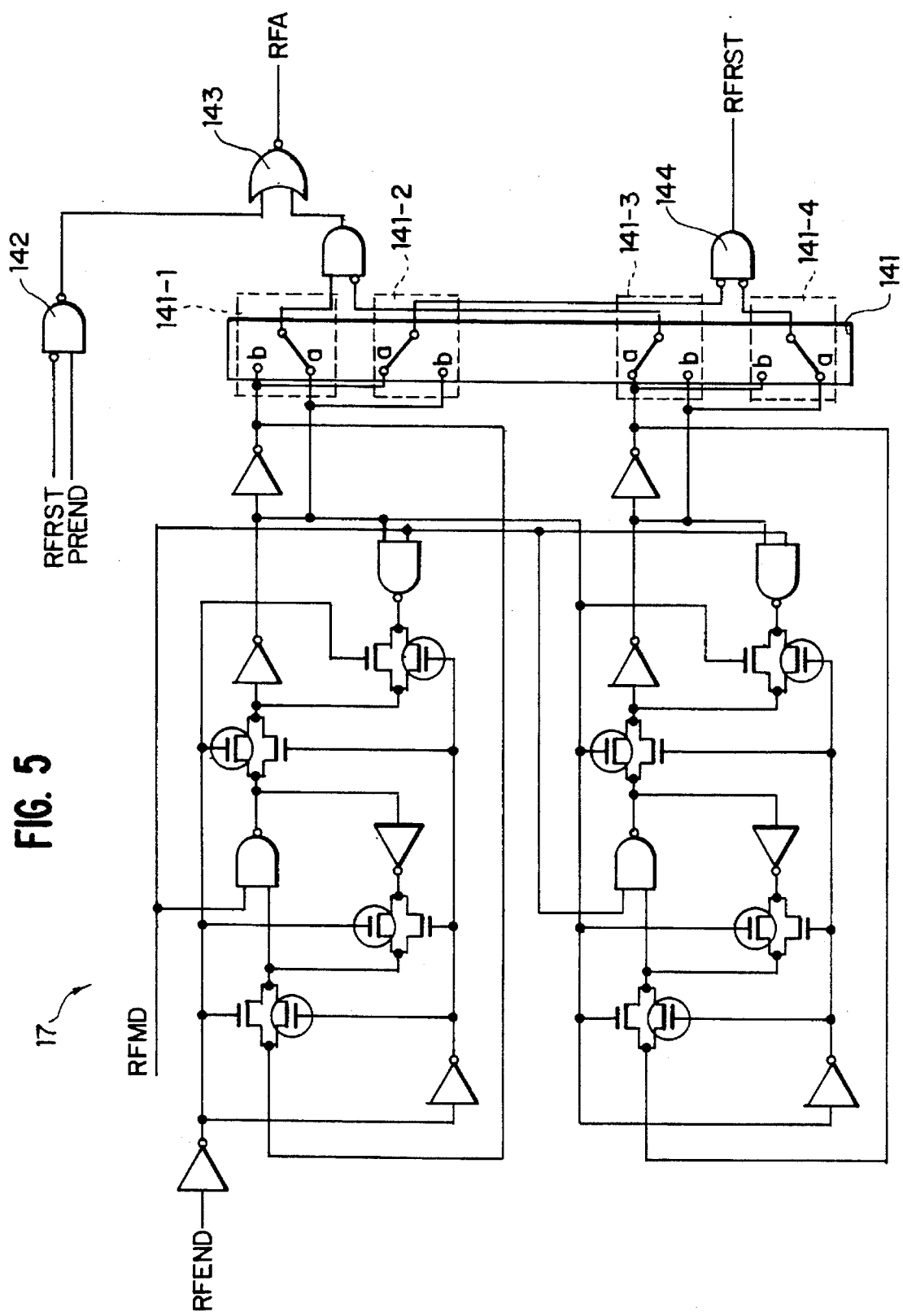
FIG. 5 is a circuit diagram showing an internal refresh counter 17 shown in FIG. 3.

Turning now to FIG. 5, the refresh counter 17 is constituted by transmission gates, inverters, NAND gates and so on which are connected as shown. As is apparent from the circuit of the refresh counter 17, by the first time generation of the refresh end signal RFEND, one input node of the NOR gate 143 is changed to the low level, and the gate 144 produces the low level refresh reset signal RFRST. Accordingly, the internal refresh request signal RFA is changed to the high level in synchronism with the precharge end signal PREND. The high level of the signal RFA produces again the refresh request signal RF-1 through the OR gate 19 (FIG. 3), as shown in FIG. 4. The low level signal RFRST causes the AND gate 18 (FIG. 3) to maintain its output at the low level irrespective of the production of the signal PREND. The refresh mode signal RFMD is thereby held at the high level, as shown in FIG. 4.

Since the signal RF-1 is produced again, the refresh control circuit 5 and the internal control circuit 4 initiates again the refresh operation. More specifically, the refresh control circuit 5 operates to transfer the updated content of the internal refresh address counter 12 to the row decoder 7 and the control circuit 4 produces the set of internal control signals 41 for a refresh operation. As a result, a new word line WLi+1 next to the word line WLi is selected by the row decoder 7 and driven by the driver 14 to the selection (high) level, as shown in FIG. 4.

When the period of time required to perform the refresh operation has elapsed, the refresh control circuit 5 changes the signal RFEND to the high level, as shown in FIG. 4. In response further to the signal RFEND, the internal control circuit 4 stops generating the refresh control signals 41. As a result, the word line WLi+1 is changed to the non-selection (low) level, as shown in FIG. 4.

On the other hand, the internal refresh counter 17 changes a refresh reset signal RFRST to the high level according to the transition of the signal RFEND from the high level to the low level, because it counts the signal RFEND twice, as shown in FIG. 4. At this time, the signal RFA is not produced. Accordingly, the flip-flop 42 is reset by the signal PREND to change the refresh mode signal RFMD to the low level. The command decoder 3 is thereby allowed to respond to a next command from the CPU 1.

Turning again to FIG. 5, the counter 17 further has four change-over wires 141-1~141-4. The connection relationship shown therein is for two refresh cycles, but a number of times for the refresh cycles can be varied by using the change-over wiring 141-1~141-4. This variation is possible by cutting and changing over the wires when manufacturing the DRAM. If the change-over wires 141-1~141-3 connect to b side, not to a side, the only one refresh cycle is executed for one refresh command from CPU 1.

The structure of the internal refresh counter 17 is not restricted to that illustrated in FIG. 5, and may be any kind of counter as long as it can carry out the above-mentioned operation. A number of times for the refresh operation set in the internal refresh counter 17 shown is previously determined during the manufacturing process and hence can not be changed from outside after manufacture. However, the present invention may be constituted in such a manner that a number of times for the refresh operation can be appropriately changed from outside after manufacture.

It is apparent that the present invention is not limited to the above embodiment but may be modified and changed without departing from the scope and spirit of the invention.

What is claimed is:

1. A semiconductor memory device comprising a memory cell array including a plurality of word lines, a plurality of bit lines and a plurality of memory cells disposed at a different one of intersections of the word and bit lines, a data read/write circuit performing a data read/write operation on a selected one of the memory cells, and a refresh circuit responding to each refresh request and performing both of a first refresh operation in which one of the word lines is selected and the memory cells associated with the one of the word lines are refreshed and a second refresh operation in which a different one of the word lines and the different memory cells associated with the different one of the word lines are refreshed.

2. The device according to claim 1, wherein said refresh circuit includes a refresh counter counting a refresh operations, said refresh circuit completing the refresh operation when a content of said refresh counter reaches a predetermined number.

3. The device according to claim 2, said refresh circuit further includes address holding means for holding addresses of said word lines for performing one refresh operation, and said refresh circuit is activated in response to a refresh request and continuously updating the addresses held in said address holding means.

4. The device according to claim 3, said refresh circuit further includes a first timer means for timing a first predetermined time, outputs a refresh end signal to said refresh counter after lapse of said first predetermined time, and updates the address held in said address holding means and operates next refresh operation every time a refresh repeat signal is input thereto; and said refresh counter counts a number of input of said refresh end signal and outputs said refresh repeat signal when a result of count is below said number of times for refreshment.

5. The device according to claim 4, said data read/write circuit includes a second timer means for timing for a second predetermined time and outputs a precharge end signal to said refresh counter after lapse of the second predetermined time; and said refresh counter outputs said refresh repeat signal in synchronism with an input of said precharge end signal.

6. The device according to claim 5, said DRAM further comprises a decoding means for decoding a command supplied from outside of the DRAM;

said decoding means does not decode the command when a refresh mode signal is active but decodes the command when said refresh mode signal is inactive and outputs a refresh request signal when said command is the refresh request;

said data read/write circuit activates said refresh mode signal when receiving said refresh request signal and deactivates said refresh mode signal when receiving a refresh reset signal; and said refresh counter outputs said refresh reset signal when a result of count equals to said number of times for refresh operations and resets said result of count.

7. A semiconductor memory device comprising: a memory cell array having a plurality of word lines, memory cells connected to each of a plurality of the word lines, and bit lines connected to the memory cells; refresh control means for refreshing in the memory cell array at every one word line; first counter means in which an address of a word line which is a target of refreshment is stored; and second counter means in which a number of times for refreshment is determined, the refresh control means select a word line to perform the refresh operation every time an address stored in the first counter means are sequentially updated in response to one refresh request issued from outside, and performs the refresh operation for every one word line which is selected by the refresh control means, whose number corresponds to a number of times for refreshment determined in the second counter means.

8. The device according to claim 7, the refresh control means comprise timer means for timing for a predetermined time, output a first signal to the second counter means after lapse of the predetermined time, and sequentially update addresses stored in the first counter means every time a second signal is supplied thereto, and the second counter means counts a number of inputs of the first signal, and outputs the second signal to the refresh control means if a result of count is below the number of times for refreshment.

9. The device according to claim 8, the semiconductor memory apparatus further comprises decoding means for decoding a command supplied from outside of the apparatus;

the decoding means does not receive the command when a third signal is active, receives the command to perform decoding when the third signal is inactive, and outputs a fourth signal when the command is the refresh request;

the refresh control means activate the third signal when the fourth signal is supplied thereto and deactivate the third signal when a fifth signal is fed thereto; and the second counter means outputs the fifth signal when the result of count equals to the number of times for refreshment and resets the result of count.

10. A semiconductor memory device comprising: a memory cell array including a plurality of word lines, a plurality of bit lines and a plurality of memory cells disposed at a different one of intersections of said word and bit lines; a command decoder receiving command information in synchronism with a clock signal supplied thereto and decoding said command information to produce decoded command data; a data read/write circuit coupled to said command decoder to receive said decoded command data, said data read/write circuit performing, when said decoded command data are representative of a data read/write request, a data read/write operation on at least one of said memory cells; and a refresh circuit coupled to said command decoder to receive said decoded command data, said refresh circuit performing, when said decoded command data are representative of a refresh request, a refresh operation at least twice; a first set of memory cells of said memory cells being refreshed by said refresh circuit performing said refresh operation firstly and a second sets of memory cells of said memory cells being refreshed by said refresh circuit performing said refresh operation secondly.

* * * * *